United States Patent
Song et al.

(10) Patent No.: US 8,304,989 B2
(45) Date of Patent: Nov. 6, 2012

(54) ORGANIC LIGHT-EMITTING DISPLAY DEVICE AND METHOD OF MANUFACTURING THE SAME

(75) Inventors: Seung-Yong Song, Yongin (KR); Young-Seo Choi, Yongin (KR); Oh-June Kwon, Yongin (KR); Sun-Young Jung, Yongin (KR); Young-Cheol Joo, Yongin (KR)

(73) Assignee: Samsung Display Co., Ltd., Yongin, Gyeonggi-do (KR)

(*) Notice: Subject to any disclaimer, the term of this patent is extended or adjusted under 35 U.S.C. 154(b) by 210 days.

(21) Appl. No.: 12/504,283

(22) Filed: Jul. 16, 2009

(65) Prior Publication Data

US 2010/0013384 A1    Jan. 21, 2010

(30) Foreign Application Priority Data

Jul. 17, 2008    (KR) .................. 10-2008-0069745

(51) Int. Cl.
*H01L 51/00* (2006.01)
*H05B 33/04* (2006.01)
(52) U.S. Cl. ..................... 313/512; 313/506
(58) Field of Classification Search ........... 313/512, 313/504, 506; 257/99
See application file for complete search history.

(56) References Cited

U.S. PATENT DOCUMENTS

| | | | | |
|---|---|---|---|---|
| 6,861,801 B2 * | 3/2005 | Kim et al. | ...... | 313/512 |
| 2001/0015618 A1 | 8/2001 | Yamazaki et al. | | |
| 2004/0046184 A1 | 3/2004 | Yanagawa et al. | | |
| 2006/0066236 A1* | 3/2006 | Tanaka et al. | ...... | 313/512 |
| 2007/0090759 A1* | 4/2007 | Choi et al. | ...... | 313/512 |
| 2008/0138653 A1* | 6/2008 | Lee et al. | ...... | 428/690 |
| 2010/0012966 A1* | 1/2010 | Choi et al. | ...... | 257/99 |

FOREIGN PATENT DOCUMENTS

| | | |
|---|---|---|
| JP | 11-008075 A | 1/1999 |
| JP | 2001-139933 | 5/2001 |
| JP | 2001-236025 A | 8/2001 |
| JP | 2003-257622 | 9/2003 |
| JP | 2004-103534 A | 4/2004 |
| JP | 2005-298703 | 10/2005 |
| KR | 10-2006-0021379 A | 3/2006 |
| KR | 10-2007-0078502 A | 8/2007 |

OTHER PUBLICATIONS

Japanese Office Action dated Feb. 15, 2011 for Japanese Application No. JP 2009-104149 which shares priority of Korean Patent Application No. KR 10-2008-0069745 with the captioned application.

* cited by examiner

*Primary Examiner* — Karabi Guharay (74) *Attorney, Agent, or Firm* — Knobbe, Martens, Olson & Bear LLP

(57) ABSTRACT

Embodiments of the disclosure provide an organic light-emitting display device and a manufacturing method of the organic light-emitting display device. The organic light-emitting display device includes a substrate; a display unit formed on the substrate; an encapsulation substrate formed above the display unit; a first sealant bonding the substrate and the encapsulation substrate; and a filler disposed between the substrate and the encapsulation substrate. In addition, a second sealant is provided to separate the first sealant and the filler. The adhesive strength of the second sealant is greater than an adhesive strength of the filler.

14 Claims, 5 Drawing Sheets

ORGANIC LIGHT-EMITTING DISPLAY DEVICE AND METHOD OF MANUFACTURING THE SAME

CROSS-REFERENCE TO RELATED APPLICATIONS

This application claims the benefit of Korean Patent Application No. 10-2008-0069745, filed on Jul. 17, 2008 in the Korean Intellectual Property Office, the disclosure of which is incorporated herein in its entirety by reference.

BACKGROUND OF THE DISCLOSURE

1. Field of the Disclosure

The present disclosure relates to an organic light-emitting display device and a method of manufacturing the same. More particularly, the present disclosure relates to an organic light emitting display device which comprises features to prevent penetration of external impurities, such as oxygen or water, and a method of manufacturing the organic light-emitting display device with these features.

2. Description of the Related Art

Recently, conventional display devices are being replaced with portable, thin flat panel display devices. Electroluminescent display devices have become widely used in flat panel display devices. An electroluminescent display device is a self-emissive display and has a wide viewing angle, high contrast ratio, and high response speed. An organic light-emitting display is one type of electroluminescent display. In an organic light-emitting display device, a light emitting layer is formed of an organic material and is popular because is has improved properties in terms of brightness, driving voltage, response speed, and can realize multiple colors in comparison to an inorganic light-emitting display device.

Figure 1:
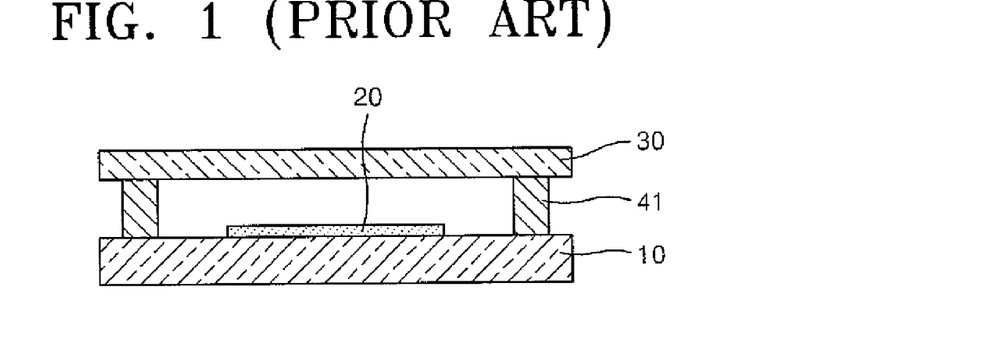
FIG. 1 is a cross-sectional view of a conventional organic light-emitting display device.

FIG. 1 is a cross-sectional view of a conventional organic light-emitting display device. Referring to FIG. 1, a display unit 20 is formed on a substrate 10, and an encapsulation substrate 30 is formed above the display unit 20. The substrate 10 and the encapsulation substrate 30 are attached to each other using a sealant 41.

A flat panel display device, particularly an organic light emitting device, may suffer deterioration because of factors, such as deterioration of the light emitting layer. For example, oxygen may contaminate the indium tin oxide (ITO) used in the electrode of the device. Deterioration may also result from a reaction between the light emitting layer and an interface. External contaminants, such as water, oxygen, ultraviolet rays reaching the organic light emitting device from the outside, and the manufacturing conditions of the organic light emitting device, may also contribute to deterioration of the device. Oxygen and water from the outside can especially affect the life span of an organic light emitting device. Thus, the protective features and packaging of the organic light emitting device can be critical.

Referring now to FIG. 1, a conventional organic light-emitting display device is shown. Impurities, such as oxygen or water, may penetrate into the organic light-emitting display device through interfaces between the sealant 41 and the encapsulation substrate 30. The display unit 20 may thus result from these impurities.

Conventionally, a filling film (not shown) or a filler (not shown) between the substrate 10 and the encapsulation substrate 30 have been employed. A dam (not shown) has also been provided between the sealant 41 and the filling film or the filler in other conventional devices.

However, a filler or filling film between the substrate 10 and the encapsulation substrate 30 may not provide adequate protection. For example, when the adhesive strength of the filler is too great, the filler does not completely spread between the substrate 10 and the encapsulation substrate 30 and unoccupied areas or gaps may remain in the device. These gaps may allow for contaminants in the device and allow for increased problems with exfoliation. For example, when an empty space or gap remains, initially a spot defect may occur due to a difference in color coordinates or luminance, when that empty space is illuminated. These empty spaces may also occur due to outgassing from the organic material or filler when reliability testing is performed. During such testing, pressure may be exerted on and around the empty space and also cause an exfoliation defect to occur.

SUMMARY OF THE DISCLOSURE

The present disclosure provides an organic light emitting display apparatus, which prevents penetration of impurities, such as oxygen or water, into an organic light-emitting display device. A method of manufacturing the organic light-emitting display apparatus is also described in the present disclosure.

According to an aspect of the present disclosure, there is provided an organic light-emitting display device comprising a substrate; a display unit formed on the substrate; an encapsulation substrate formed above the display unit; a first sealant bonding the substrate and the encapsulation substrate; a filler filled in a space between the substrate and the encapsulation substrate; and a second sealant interposed between the first sealant and the filler so as to separate the filler from the first sealant, wherein an adhesive strength of the second sealant is greater than an adhesive strength of the filler.

According to another aspect of the present disclosure, there is provided a method of manufacturing an organic light emitting device, the method comprises: forming a display unit on a surface of a substrate; providing an encapsulation substrate; disposing a first sealant on the surface of the substrate; disposing a second sealant in the first sealant, on the substrate; coating a filler having an adhesive strength smaller than an adhesive strength of the second sealant, in the second sealant of the substrate; and bonding the substrate and the encapsulation substrate to each other using the first sealant.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION OF VARIOUS EMBODIMENT

The present disclosure will now be described more fully with reference to the accompanying drawings, in which exemplary embodiments of the disclosure are shown.

Figure 2:
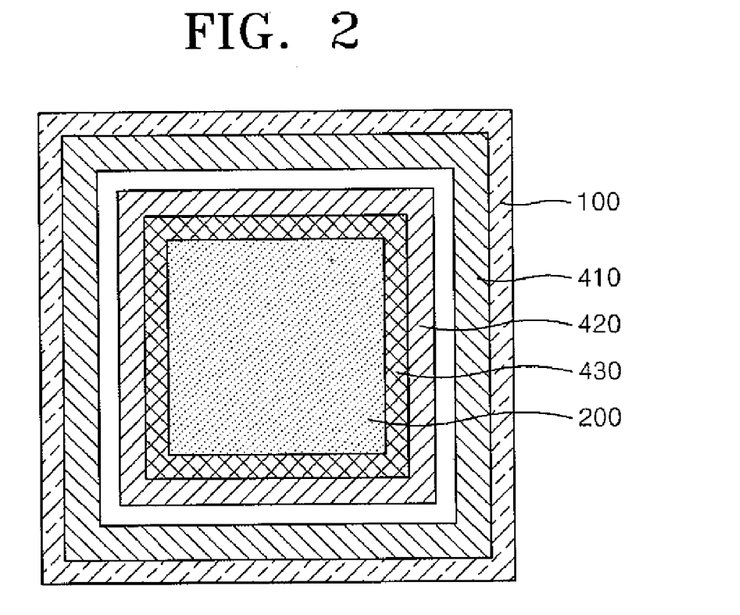
FIG. 2 is a plane view of a portion of an organic light-emitting display device according to an embodiment of the present disclosure.
Figure 3:
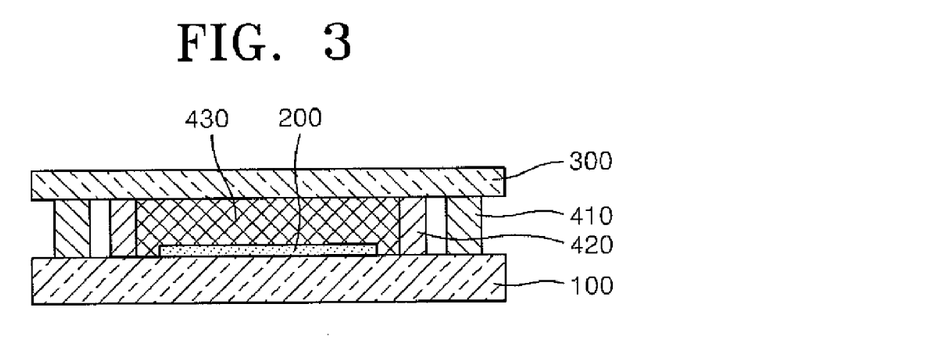
FIG. 3 is a cross-sectional view of the organic light-emitting display device of FIG. 2.

FIG. 2 is a plan view of a portion of an organic light-emitting display device according to an embodiment of the present disclosure. FIG. 3 is a cross-sectional view of the organic light-emitting display device of FIG. 2. These figures are further described below.

Referring to FIGS. 2 and 3, a display unit 200 is provided as an organic light emitting device is formed on a substrate 100. The substrate 100 may be formed of transparent glass containing $SiO_2$ as a component, but is not limited thereto. Substrate 100 may also be formed of a transparent plastic material that may be an insulating organic material. Exemplary organic materials that may be used include polyethersulphone (PES), polyacrylate (PAR), polyetherimide (PEI), polyethyelene napthalate (PEN), polyethyelene terephthalate (PET), polyphenylene sulfide (PPS), polyallylate, polyimide, polycarbonate (PC), triacetate cellulose (TAC), and cellulose acetate propionate (CAP).

Embodiments of the present disclosure relate to both bottom-emission and top-emission type devices. In a bottom-emission type organic light-emitting display device, the displayed image is realized toward the substrate 100 (assuming that substrate 100 is the bottom of the device). Accordingly, the substrate 100 may be formed of a transparent material. In a top-emission type organic light-emitting display device, the image is realized away from the substrate 100 (again assuming that substrate 100 is the bottom of the device). Accordingly, the substrate 100 may be a non-transparent material, such as, a metal. When the substrate 100 is formed of a metal, the substrate 100 may be constructed of at least one material, such as, carbon, iron, chromium, manganese, nickel, titanium, molybdenum, stainless steel (SUS), Invar alloys, Inconel alloys, and Kovar alloys. One skilled in the art will recognize that the present disclosure is not limited to the above examples. For example, the substrate 100 may be formed of a metal foil.

Although not illustrated in the drawings, a buffer layer may be further formed on a top surface of the substrate 100. This buffer layer may be used to planarize the substrate 100 and prevent penetration of impurities, especially in bottom-emission type organic light-emitting display devices.

As shown in FIG. 3, the substrate 100, including the display unit 200, may be attached to another substrate, such as encapsulation substrate 300. For purposes of explanation, the present description refers to the encapsulation substrate 300 as being disposed above the substrate 100 and display unit 200. The encapsulation substrate 300 may be formed not only of a glass material, but also of various plastic materials, such as acryl. Furthermore, in some instances, the encapsulation substrate 300 may be formed from a metal.

As shown in FIGS. 2 and 3, the device may comprise a first sealant 410, a second sealant 420, and a filler 430. These components are further described below.

The substrate 100 and the encapsulation substrate 300 are attached to each other using a first sealant 410. The first sealant 410 may be a sealing glass frit. Glass frits are well known to those skilled in the art.

In addition to the first sealant 410, a second sealant 420 may be disposed between the first sealant 410 and the filler 430. The second sealant 420 may serve as a boundary or barrier structure, such as a dam, that can serve as a separation between first sealant 410 and the filler 430. This protection by the second sealant 420 may provide several benefits. For example, if the first sealant 410 and the filler 430 become bonded or mixed with each other, the first sealant 410 may not properly function as a sealant. Also, if the first sealant 410 is formed of frit and the frit's surface is contaminated because it is bonded to the filler 430, exfoliation can occur when laser sealing is performed. Furthermore, if the first sealant 410 is formed of a UV curing agent, sealing may be inadequate because the filler 430 may block UV light from reaching the curing agent. Accordingly, the second sealant 420 may be employed in various embodiments. In some embodiments, the second sealant 420 is formed to provide a predetermined distance from the first sealant 410. In particular, a relatively small distance may be used to the first sealant 410 from mixing or bonding with the filler 430 may be sufficient. For example, in some embodiments, the second sealant 420 may provide a distance of about 50 μm or more. Of course, process margins and tolerance may also be considered in the distance to be provided by the second sealant 420. This predetermined distance may remain as a gap or spacing between first sealant 410 and second sealant 420, or may be filled in with yet another filler or filling film.

The second sealant 420 may be formed of an organic sealant, an inorganic sealant, or a mixture of the organic and inorganic sealants. The organic sealant for second sealant 420 may be at least one material, such as, acrylic resin, methacrylic resin, polyiroprene, vinylic resin, epoxy resin, urethane resin, and cellulose resin. Examples of the acrylic resin include butylacrylate, ethylhexyl acrylate, etc. Examples of the methacrylic resin include propylene glycol methacrylate, tetrahydropyran-free methacrylate, etc. Examples of the vinylic resin include vinyl acetate, N-vinyl pyrrolidone. Examples of the epoxy resin include cycloaliphatic epoxide. Examples of the urethane resin include urethane acrylates. Examples of the cellulose resin include cellulose nitrate.

Examples of the inorganic sealant for second sealant 420 include metals such as silicon, aluminium, titanium, zirconium, and non-metals, such as, metal oxides like titania, silicon oxide, zirconia, and alumina of these substances.

An organic/inorganic hybrid binder may also be used in the embodiments and is a material in which a non-metal or metal such as silicon, aluminium, titanium, zirconium, etc., is covalently bonded to an organic material. The organic/inorganic hybrid binder may be at least one material, such as, epoxy silane and its derivative, a vinyl silane and its derivative, amine silane and its derivative, methacrylate silane, and a resultant material of a partial hardening reaction of any of these substances. Examples of the epoxy silane and its derivative include 3-glycidoxypropyltrimethoxysilane and its polymer. Examples of the vinyl silane and its derivative include vinyltriethoxysilane and its polymer. Also, examples of the amine silane and its derivative include 3-aminopropyltriethoxysilane and its polymer. Examples of the methacrylate silane and its derivative include 3-(trimethoxysilyl)propyl acrylate and its polymer.

In the embodiments shown in FIGS. 2 and 3, a filler 430 is also provided in a space between the substrate 100 and the encapsulation substrate 300. Materials that may used as the filler 430 include organic sealants, such as urethane resin, or acrylic resin, or inorganic sealants. Examples of the urethane resin include urethane acrylates, and examples of the acrylic resin include butyl acrylate, ethylhexyl acrylate, etc.

In some embodiments, the adhesive strength of the second sealant 420 is greater than that of the filler 430. As described above, the display unit 200 including the organic light emitting device can be vulnerable to oxygen or water from the outside. Thus, penetration of these impurities into the organic light-emitting display device may be desirable. In addition, preventing damage due to external shock may also be desirable.

For these and other benefits, the filler 430 may be employed in the embodiments. However, if the adhesive strengths of the filler 430 and the second sealant 420 are not appropriately selected or adjusted, the second sealant 420 may be unable to function as a barrier structure or dam that adequately separates the filler 430 from other the other components. For example, if the filler 430 and the first sealant 410 are not adequately separated by the second sealant 420, exfoliation problems in the device may worsen. In order to solve this problem and others, it was discovered that having the adhesive strength of the second sealant 420 being greater than that of the filler 430 can be advantageous.

Examples of the second sealant 420 may include epoxy resin which is organic sealant, or silicon resin, which is an inorganic sealant. In addition, examples of the filler 430 may include urethane resin or acrylic resin, which is an organic sealant, or silicon resin, which is inorganic sealant. Examples of the adhesive strengths of the second sealant 420 and the filler 430 are shown in Tables 1 and 2 below.

TABLE 1

| Exemplary adhesive strengths of second sealant 420 | |
|---|---|
| Epoxy resin | 3.7 MPa, 9.8 MPa, 14 MPa, 16 MPa |
| Silicon resin | 1.0 MPa, 1.2 MPa |

TABLE 2

| Exemplary adhesive strengths of filler 430 | |
|---|---|
| Urethane resin | 0.2 MPa |
| Silicon resin | 0.1 MPa, 0.3 MPa, 0.8 MPa |
| Acrylic resin | 1.37 MPa, 1.7 MPa, 2.9 MPa |

As noted, it was discovered that it may be advantageous to utilize a filler 430 with a lower adhesive strength relative to the second sealant 420. For example, in some embodiments, the second sealant 420 was formed using epoxy resin, the adhesive strength of the epoxy resin may have a greater adhesive strength than urethane resin, silicon resin or acrylic resin used for forming the filler 430, as shown in Tables 1 and 2. In other embodiments, when the second sealant 420 is formed of silicon resin, the adhesive strength of silicon resin may be greater than urethane resin or silicon resin used for forming the filler 430, as shown in Tables 1 and 2.

One advantage or benefit of this feature is the second sealant 420 can function as a barrier structure or dam that separates the filler 430 from the first sealant 410. This separation, among other things, was found to reduce the number of defective products having a defoliation problem, etc.

In general, the adhesive strength of the second sealant 420 should be sufficient to hold the substrate 100 and the encapsulation substrate 300 to withstand the forces applied towards the second sealant 420 when the filler 430 is spread. If the adhesive strength of second sealant 420 is insufficient, the second sealant 420 may not adequately function as a dam. In these instances, the second sealant 420 may spread over the filler 430, or vice versa. FIG. 4B shows an example of this phenomenon.

In some embodiments, the filler 430 may be made of a material having an adhesive strength that is equal to or less than 0.2 MPa. In these embodiments, fillers with this level of adhesive strength were found to more efficiently fill the space between the substrate 100, encapsulation 300, and the second sealant 420. In certain instances, fillers with higher adhesive strengths were found to occasionally fail in completely filling the space between the substrate 100 and the encapsulation substrate 300, and thereby generating gaps or spots. Accordingly, in the present embodiments, fillers with a relatively lower adhesive strength, such as equal to or less than 0.2 MPa, may be used.

One skilled in the art will recognize that fillers with different adhesive strengths may be used in embodiments of the present disclosure. According to the present disclosure, the filler 430 and the first sealant 410 are separated by the second sealant 420, and the material of filler 430 is selected to promote complete spreading and filling between the substrate 100 and the encapsulation substrate 300, thereby preventing spots or gaps from being generated in the device.

Figure 4A:
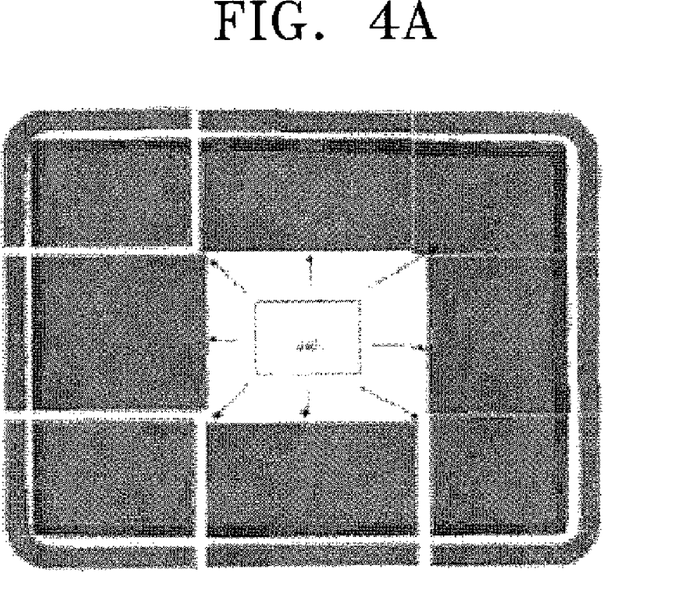
FIGS. 4A and 4B illustrate various examples of organic light-emitting display devices that include a second sealant and a filler having different adhesive strengths.
Figure 4B:
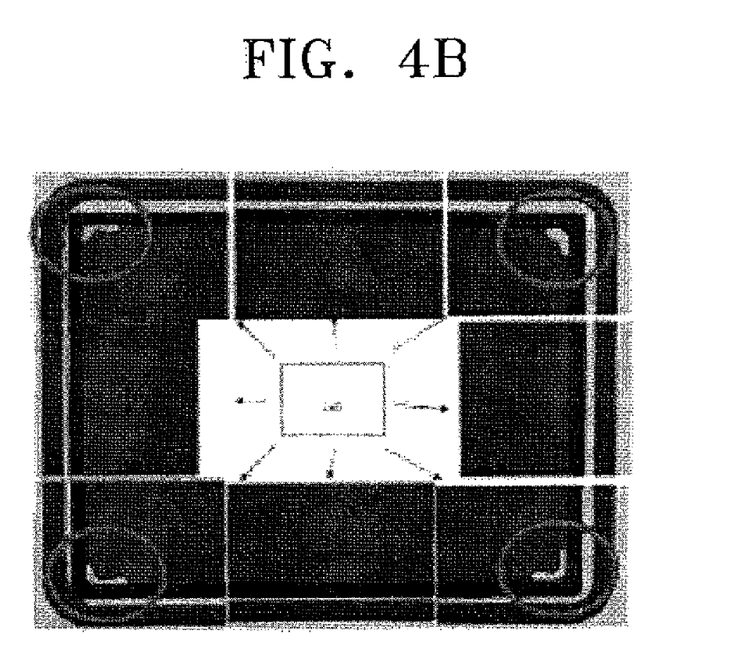

Referring now to FIG. 4A, a device is shown in which the filler 430 completely fills the space between the substrate 100 and the encapsulation substrate 300. In these examples, the filler 430 is formed of urethane resin having an adhesive strength equal to or less than 0.2 MPa, or silicon resin having an adhesive strength of 0.1 MPa. As shown, the filler 430 is uniformly spread, generally without gaps or spots, between the substrate 100 and the encapsulation substrate 300.

Referring now to FIG. 4B, a device is shown in which the filler does not completely fill the space between the substrate 100 and the encapsulation substrate 300. In these example, the filler 430 is formed of acrylic resin or silicon resin having an adhesive strength of 0.3 MPa or 0.8 MPa. As shown, the filler 430 did not completely spread between the substrate 100 and the encapsulation substrate 300, thereby spots or gaps formed in the device.

Figure 5:
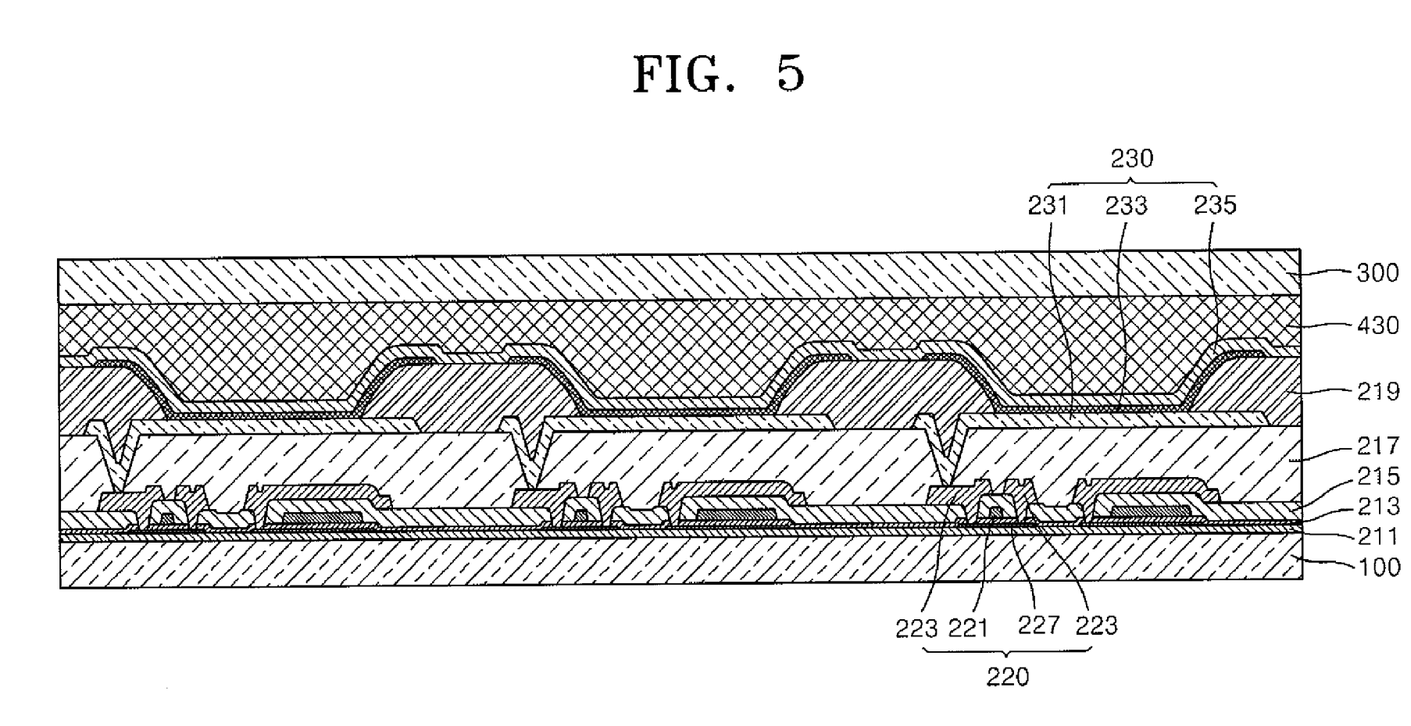
FIG. 5 is a cross-sectional view of a portion of the organic light-emitting display device of FIG. 2.

FIG. 5 is a cross-sectional view of a portion of the organic light-emitting display device of FIG. 2, showing a detailed configuration of the display unit 200. As shown, a plurality of thin film transistors 220 are formed on the substrate 100, and an organic light emitting device 230 is formed on each of the thin film transistors 220. The organic light emitting device 230 includes a pixel electrode 231 electrically connected to the thin film transistor 220, a counter electrode 235 disposed overall on the substrate 100, and an intermediate layer 233 disposed between the pixel electrode 231 and the counter electrode 235 and including at least a light emitting layer.

The thin film transistors 220 are formed on the substrate 100 and can include a gate electrode 221, source and drain electrodes 223, a semiconductor layer 227, a gate insulating layer 213, and an interlayer insulating layer 215. One skilled in the art will recognize that the present embodiment is not limited to the use of thin film transistors. Other various thin film transistors, such as, an organic thin film transistor including a semiconductor layer formed of an organic material or a silicon thin film transistor formed of silicon may also be used. A buffer layer 211 formed of a silicon oxide or a silicon nitride may be further formed between the thin film transistors 220 and the substrate 100.

The pixel electrode 231 functions as an anode and the counter electrode 235 functions as a cathode electrode, or vice versa. The pixel electrode 231 may be formed as a transparent electrode or a reflective electrode. When formed as a transparent electrode, the pixel electrode 231 may be formed of indium tin oxide (ITO), indium zinc oxide (IZO), ZnO, or $In_2O_3$. When formed as a reflective electrode, the pixel electrode 231 may include a reflection layer formed of Ag, Mg, Al, Pt, Pd, Au, Ni, Nd, Ir, Cr or compound of any of these, and a layer, formed of ITO, IZO, ZnO, or $In_2O_3$, formed on the reflection layer.

A plurality of intermediate layers 233 including at least a light emitting layer may be formed between the pixel electrode 231 and the counter electrode 235. In the present embodiment, the intermediate layer 233 may be formed of a low molecule organic material or a polymer organic material. When formed of a low molecule organic material, the intermediate layer 233 may have a single-layer or multiple-layer structure in which a hole injection layer (HIL), a hole transport layer (HTL), an organic light emission layer (EML), an electron transport layer (ETL), and an electron injection layer (EIL) are stacked. Examples of the organic material include copper phthalocyanine (CuPc), N,N'-Di(naphthalene-1-yl)-N,N'-diphenyl-benzidine (NPB), tris-8-hydroxyquinoline aluminum (Alq3), etc. The low molecule organic material may be formed using a vacuum deposition method using masks. When formed of a polymer organic material, the intermediate layer 233 may have a structure formed of an HTL and an EML; the HTL may be formed of poly(3,4-ethylenedioxythiophene) (PEDOT), and the EML may be formed of polyphenylenevinylene (PPV) and polyfluorene.

The counter electrode 235 may be formed as a transparent electrode or a reflective electrode. When formed as a transparent electrode, the counter electrode 235 may include a layer in which Li, Ca, LiF/Ca, LiF/Al, Al, Mg, or a compound of any of these is deposited toward the intermediate layer 233 between the pixel electrode 231 and the counter electrode 235, and may also include a bus electrode line and an auxiliary electrode formed of ITO, IZO, ZnO, or $In_2O_3$. When formed of a reflective electrode, the counter electrode 235 may be formed by depositing Li, Ca, LiF/Ca, LiF/Al, Al, Mg or a compound of any of these.

Also, a pixel defining layer (PDL) 219 can be formed to cover the edge of the pixel electrode 231 and to have a predetermined thickness away from the pixel electrode 231. Besides the function of defining a light emitting region, in the edge portion of the PDL 219, the counter electrode 235 is spaced apart from the pixel electrode 231 by a distance corresponding to the thickness of the PDL 219 located therebetween. Accordingly, concentration of an electric field on the edge portion of the pixel electrode 231 is prevented, thereby preventing a short circuit between the pixel electrode 231 and the counter electrode 235.

The organic light emitting device 230 can be electrically connected to the thin film transistor 220 disposed therebelow; if a planarization layer 217 is formed to cover the thin film transistor 220, the organic light emitting device 230 is disposed on the planarization layer 217, and the pixel electrode 231 of the organic light emitting device 230 is electrically connected to the thin film transistor 220 via contact holes formed in the planarization layer 217. The organic light emitting device 230 formed on the substrate 100 can be sealed by the encapsulation substrate 300. The encapsulation substrate 300 may be formed of various materials such as glass or plastic, as described above.

Also, the filler 430 can fill in the space between the organic light emitting device 230 and the encapsulation substrate 300, thereby preventing exfoliation or breakage of cells of the organic light emitting device 230. In the above described structure, the first sealant 410 is disposed along the edge of the encapsulation substrate 300 or to cover the display unit 200, and the second sealant 420 is disposed in the first sealant 410 so as to separate the first sealant 410 and the filler 430 from each other, and thus penetration of impurities into the organic light-emitting display device 230 and damage to the display unit 200 can be efficiently prevented.

FIGS. 6A through 6E are cross-sectional views for describing a method of manufacturing an organic light-emitting display device, according to an embodiment of the present disclosure. As shown, the method of manufacturing an organic light-emitting display device includes forming a display unit on a surface of a substrate, providing an encapsulation substrate, disposing a first sealant on the surface of the substrate, disposing a second sealant in the first sealant, coating a filler having an adhesive strength smaller that of the second sealant, in the second sealant of the substrate, and bonding the substrate and the encapsulation substrate to each other using the first sealant.

Figure 6A:
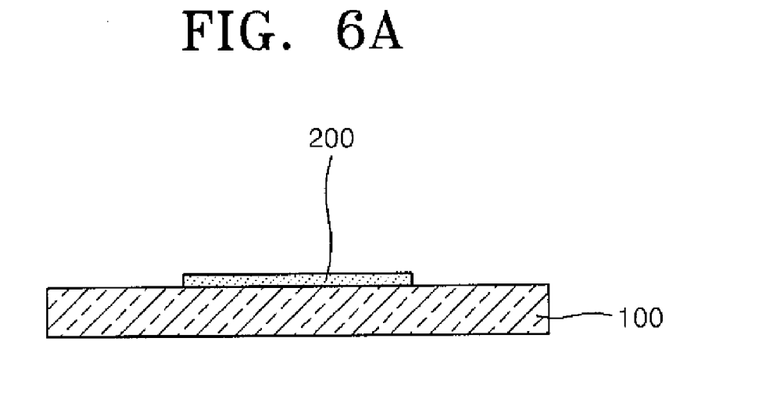
FIGS. 6A through 6E are cross-sectional views for describing a method of manufacturing an organic light-emitting display device, according to an embodiment of the present disclosure.

First, as illustrated in FIG. 6A, the display unit 200 is formed on a surface of the substrate 100. The substrate 100 may be formed as a glass substrate, or various plastic substrates such as acryl, or furthermore, a metal substrate. The substrate 100 may further include a buffer layer (not shown).

Next, the encapsulation substrate 300 is provided. The encapsulation substrate 300 may also be formed as a glass substrate, or various plastic substrates such as acryl, or furthermore, a metal substrate.

Figure 6B:
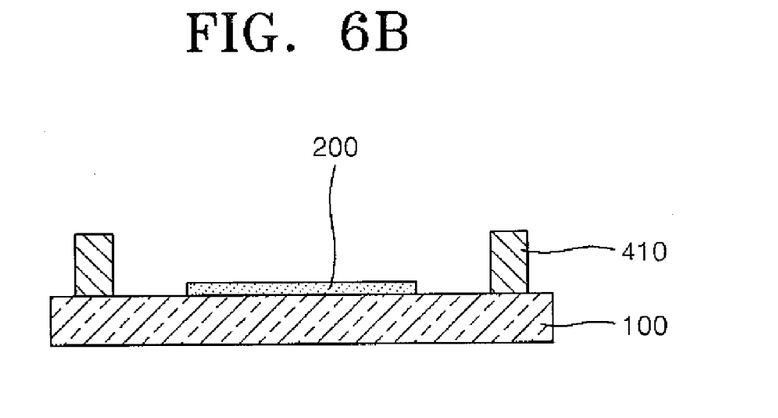

Next, as illustrated in FIG. 6B, the first sealant 410 is disposed on the surface of the substrate 100. The first sealant 410 may be formed of generally used material such as sealing glass frit.

Figure 6C:
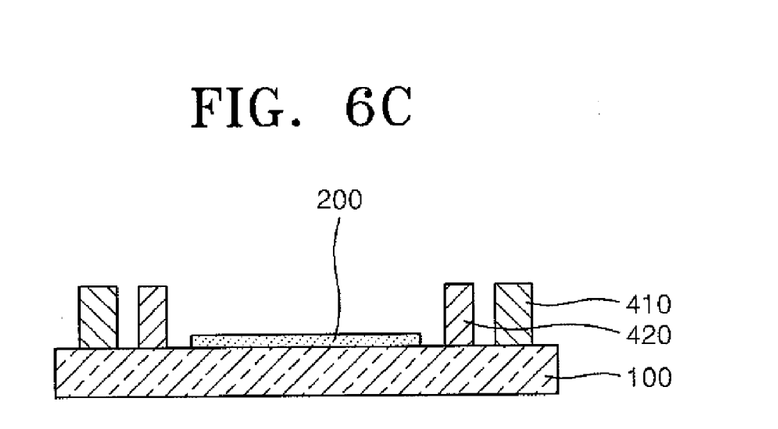

Next, as illustrated in FIG. 6C, the second sealant 420 is disposed in the first sealant 410 of the substrate 100. The second sealant 420 functions as a barrier structure or dam for separating the first sealant 410 and the filler 430 from each other. In some embodiments, the second sealant 420 is disposed so as to be separated from the first sealant 410 by a predetermined distance. The second sealant 420 may be formed of an organic sealant, an inorganic sealant, an organic/inorganic hybrid sealant, or a mixture of these.

Figure 6D:
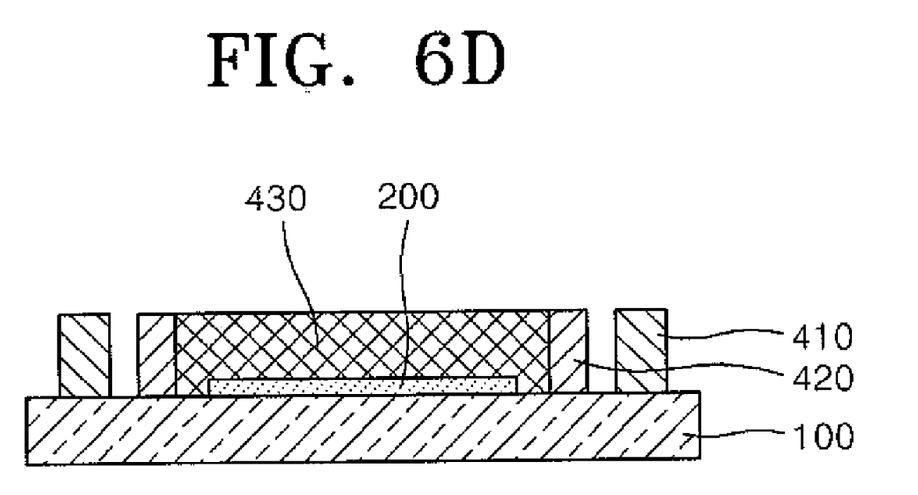

Next, as illustrated in FIG. 6D, the filler 430 having an adhesive strength smaller than that of the second sealant 420 is coated in the second sealant 420 of the substrate 100. Examples of the second sealant 420 may include epoxy resin which is organic sealant, or silicon which is inorganic sealant. In addition, examples of the filler 430 may include urethane resin or acrylic resin which is organic sealant, or silicon which is inorganic sealant. As described above, the adhesive strength of the second sealant 420 is selected to be greater than that of the filler 430. However, any material for the second sealant 420 that can function properly as a dam for separating the filler 430 from the second sealant 420 may be employed. In some embodiments, the filler 430 is a material having an adhesive strength equal to or less than 0.2 MPa.

Figure 6E:
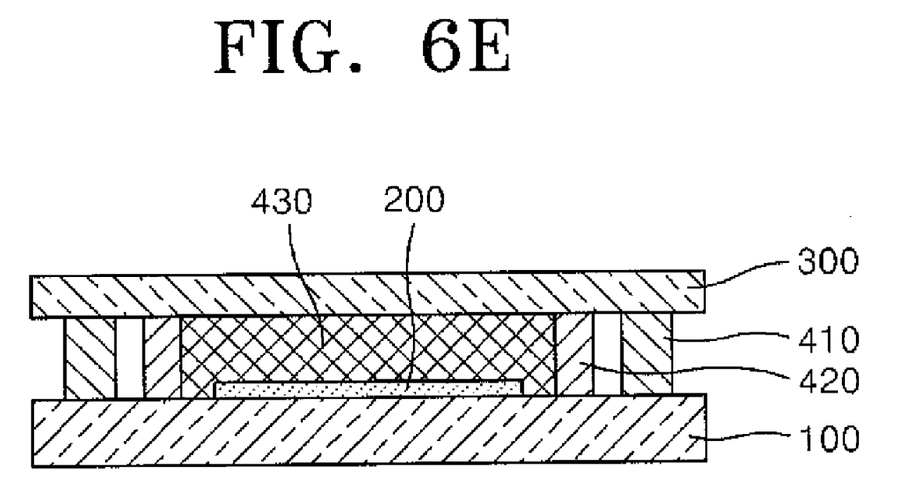

Finally, as illustrated in FIG. 6E, the substrate 100 and the encapsulation substrate 300 are bonded to each other using the first sealant 410. That is, the first sealant 410 is hardened by partially irradiating laser to the first sealant 410, with a laser irradiator, and thus, bond the substrate 100 and the encapsulation substrate 300.

In some embodiments, the filler 430 and the first sealant 420 can be completely separated and the filler 430 is completely spread between the substrate 100 and the encapsulation substrate 300, thereby preventing spots from being generated.

While the present disclosure has been particularly shown and described with reference to exemplary embodiments thereof, it will be understood by one of ordinary skill in the art that various changes in form and details may be made therein without departing from the spirit and scope of the present disclosure as defined by the following claims.

What is claimed is:

1. An organic light-emitting display device comprising:
a substrate;
a display unit formed on the substrate;
an encapsulation substrate formed above the display unit;
a first sealant bonding the substrate and the encapsulation substrate;
an adhesive filler filled in a space between the substrate and the encapsulation substrate; and
a second sealant interposed between the first sealant and the filler so as to separate the filler from the first sealant, wherein the first and second sealants are formed of different sealing materials, wherein the first sealant is formed of frit and farther from the display unit than the second sealant,
and wherein an adhesive strength of the second sealant is greater than an adhesive strength of the filler.

2. The organic light-emitting display device of claim 1, wherein the adhesive strength of the filler is less than or equal to 0.2 MPa.

3. The organic light-emitting display device of claim 1, wherein the filler comprises at least one of urethane resin, acrylic resin and silicon resin.

4. The organic light-emitting display device of claim 1, wherein the second sealant comprises at least one of epoxy resin and silicon resin.

5. The organic light-emitting display device of claim 1, wherein the first sealant is disposed along an edge of the encapsulation substrate.

6. The organic light-emitting display device of claim 1, wherein the filler substantially completely fills a space between the substrate and the encapsulation substrate.

7. The organic light-emitting display device of claim 1, wherein the filler covers the display unit.

8. An organic light-emitting display device comprising:
a first substrate;
a display unit formed on the substrate;
a second substrate formed above the display unit;
a first sealant bonding the substrate and the second substrate;
a second sealant formed at least a predetermined distance from the first sealant; and
an adhesive filler filling a space between the first substrate, the second substrate, and the second sealant, wherein the filler comprises a material having an adhesive strength that less than a adhesive strength of the second sealant, wherein the first and second sealants are formed of different sealing materials, and wherein the first sealant is formed of frit and farther from the display unit than the second sealant.

9. The organic light-emitting display device of claim 8, wherein the adhesive strength of the filler is less than or equal to 0.2 MPa.

10. The organic light-emitting display device of claim 8, wherein the filler comprises at least one of urethane resin, acrylic resin, and silicon resin.

11. The organic light-emitting display device of claim 8, wherein the second sealant comprises at least one of epoxy resin and silicon resin.

12. The organic light-emitting display device of claim 8, wherein the first sealant is disposed along an edge of the encapsulation substrate.

13. The organic light-emitting display device of claim 8, wherein the filler fills a space between the substrate and the encapsulation substrate.

14. The organic light-emitting display device of claim 8, wherein the filler covers the display unit.

* * * * *